United States Patent
Ni et al.

(10) Patent No.: US 7,269,004 B1
(45) Date of Patent: Sep. 11, 2007

(54) LOW-PROFILE USB DEVICE

(75) Inventors: Jim Ni, San Jose, CA (US); Ren-Kang Chiou, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 77 days.

(21) Appl. No.: 11/112,501

(22) Filed: Apr. 21, 2005

(51) Int. Cl.
*G06F 1/16* (2006.01)

(52) U.S. Cl. ............... 361/686; 361/737; 361/727; 439/79; 439/607

(58) Field of Classification Search .......... 361/737, 361/727, 683–686, 715, 752; 439/607, 374, 439/79, 379, 610, 680
See application file for complete search history.

(56) References Cited

U.S. PATENT DOCUMENTS

| | | | |
|---|---|---|---|
| 6,618,243 B1 | 9/2003 | Tirosh | |
| 6,854,984 B1 | 2/2005 | Lee et al. | |
| 6,900,988 B2* | 5/2005 | Yen | 361/737 |
| 6,944,028 B1* | 9/2005 | Yu et al. | 361/737 |
| 2001/0038547 A1* | 11/2001 | Jigour et al. | 365/43 |
| 2003/0100203 A1 | 5/2003 | Yen | |
| 2004/0145875 A1* | 7/2004 | Yu et al. | 361/752 |
| 2005/0248926 A1* | 11/2005 | Asom et al. | 361/752 |

\* cited by examiner

*Primary Examiner*—Tuan T. Dinh
*Assistant Examiner*—Hung S. Bui
(74) *Attorney, Agent, or Firm*—Bever, Hoffman & Harms, LLP; Patrick T. Bever

(57) ABSTRACT

A low-profile Universal-Serial-Bus (USB) device includes a PCBA in which all of the ICs are formed on a side of a PCB opposite to the metal contacts. The ICs include, for example, a USB controller chip and flash memory chip or communication chip. A housing is attached over the ICs and extends a minimum height above the metal contacts.

21 Claims, 13 Drawing Sheets

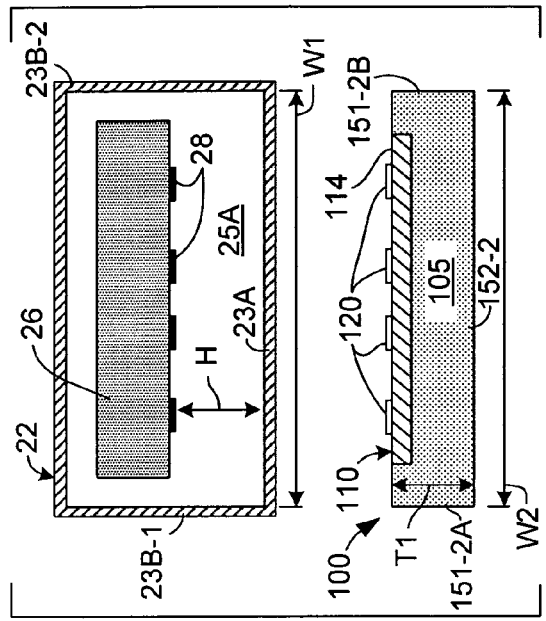
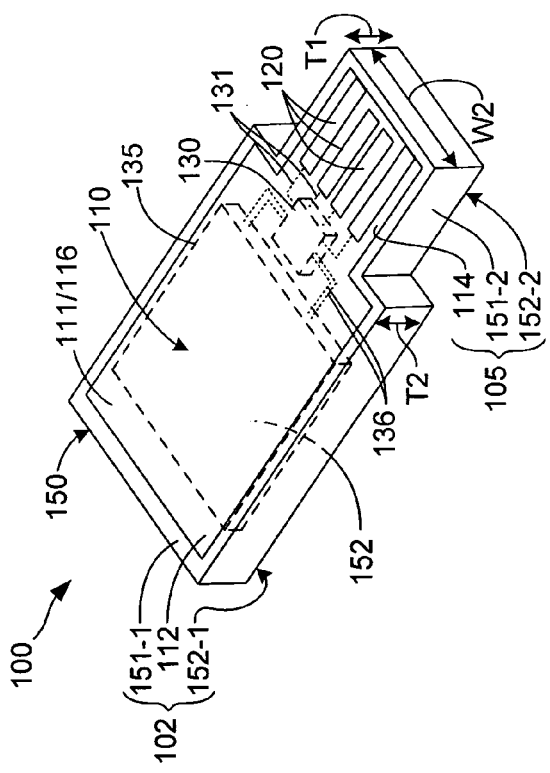
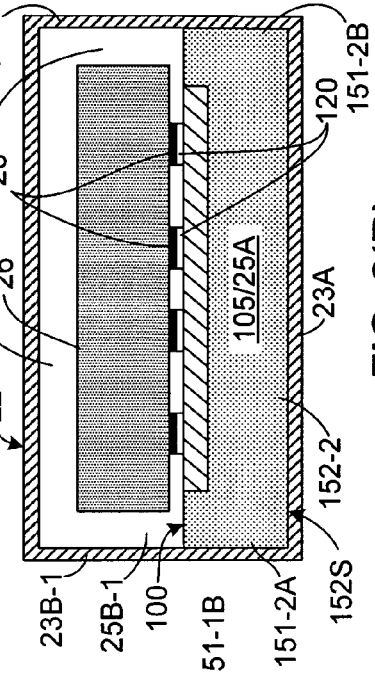
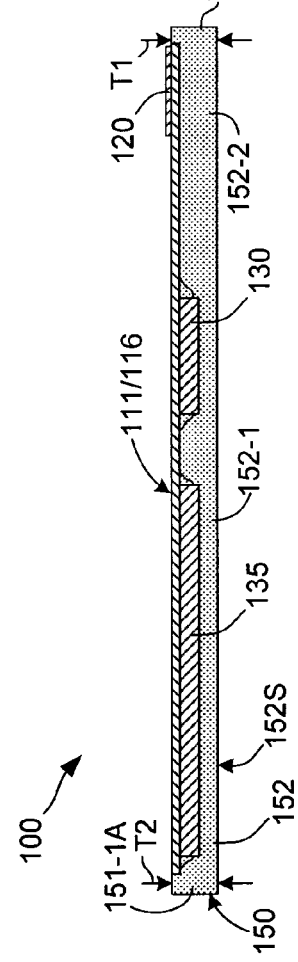
FIG. 1(A)
FIG. 1(B)
FIG. 2(A)
FIG. 2(B)

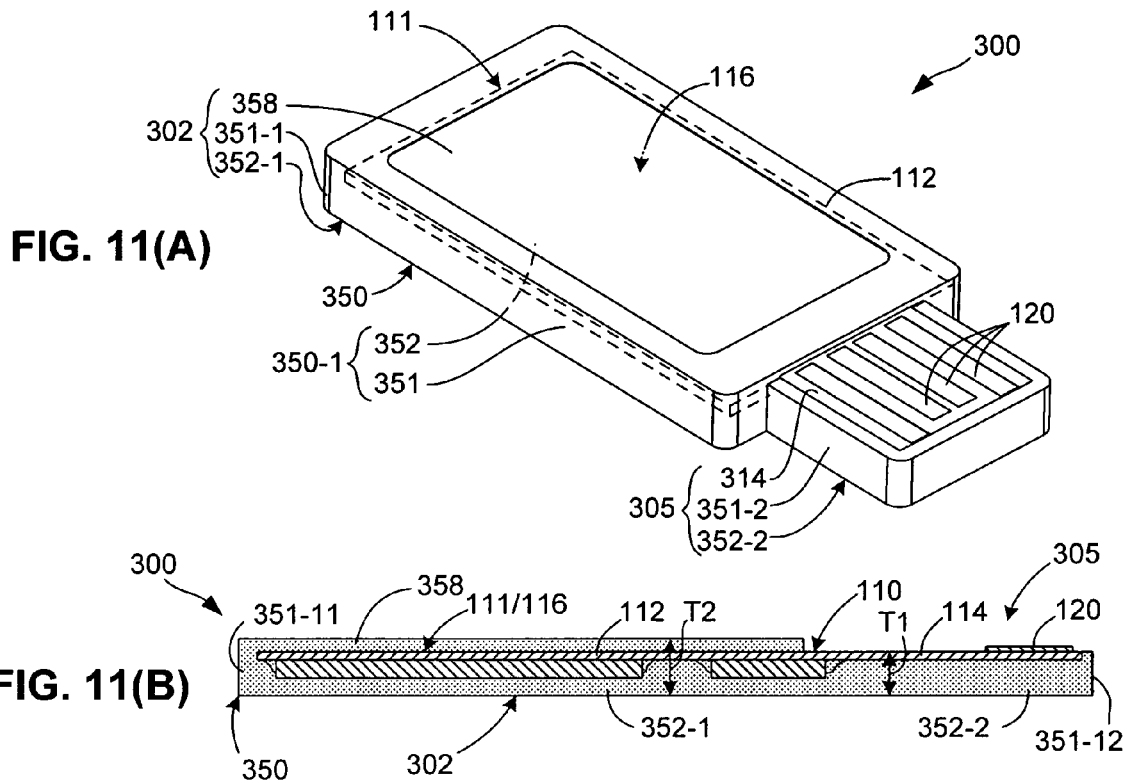
FIG. 11(A)
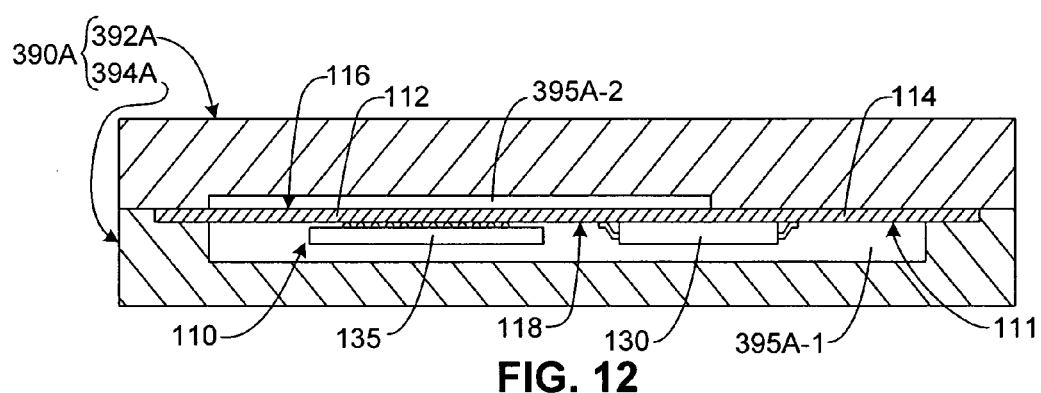
FIG. 11(B)
FIG. 12
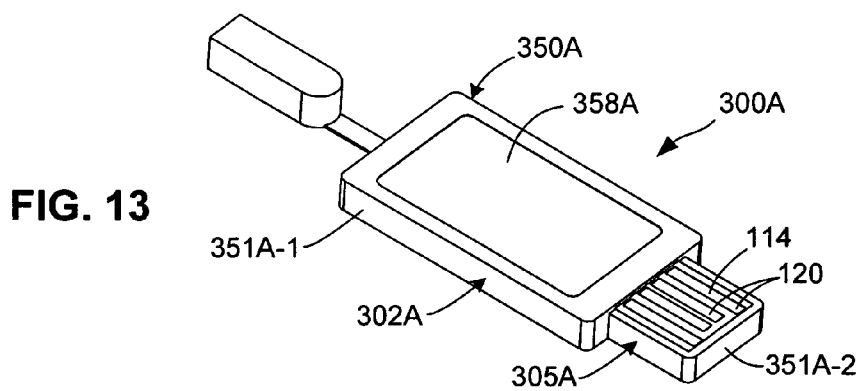
FIG. 13

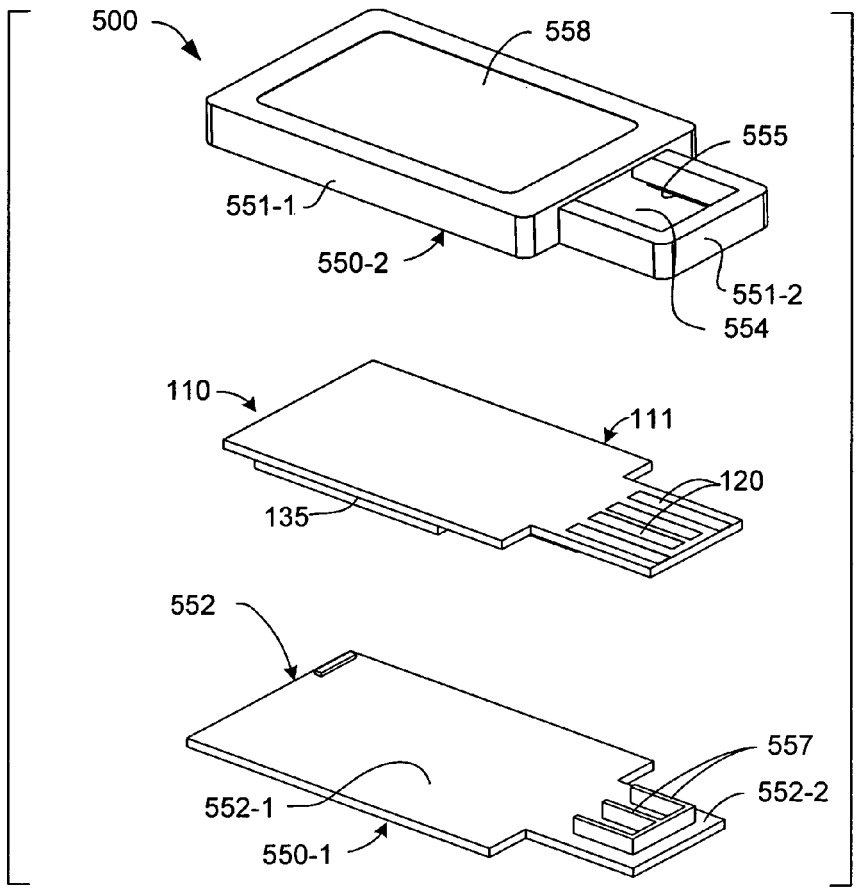
FIG. 20
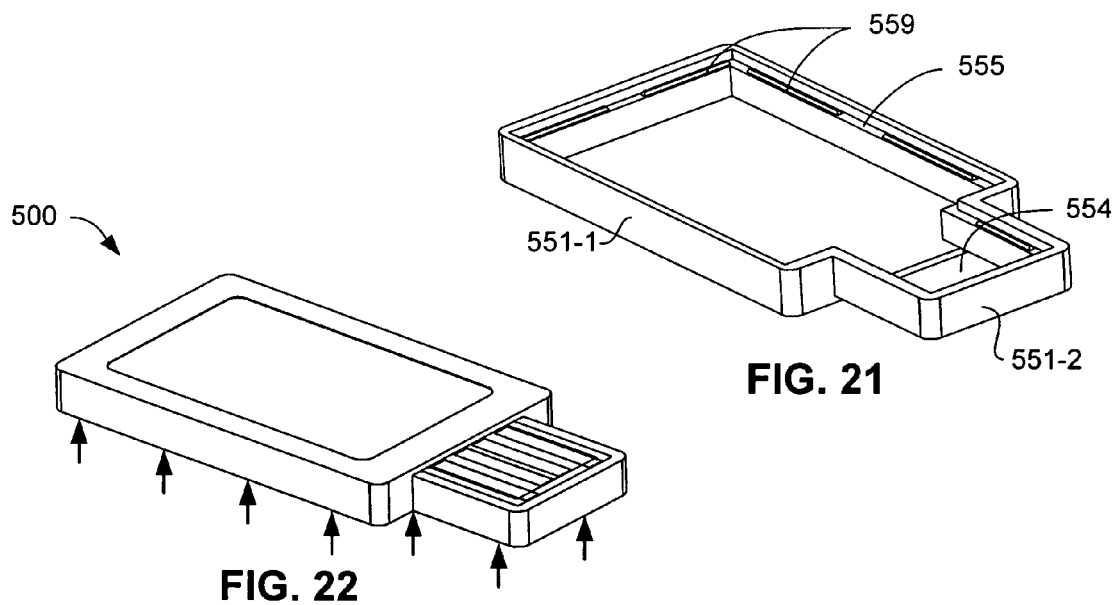
FIG. 21
FIG. 22

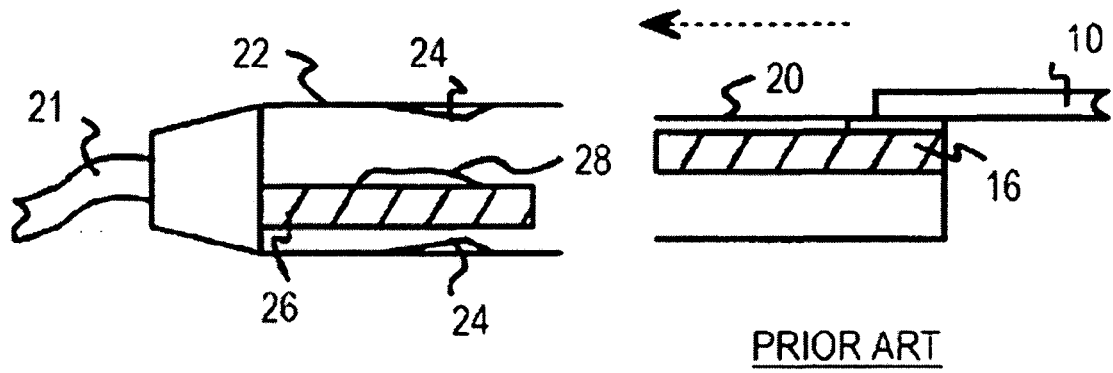
FIG. 26(A) PRIOR ART
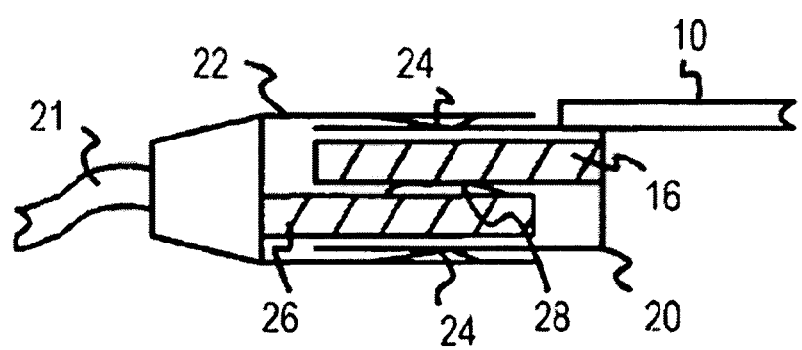
PRIOR ART FIG. 26(B)

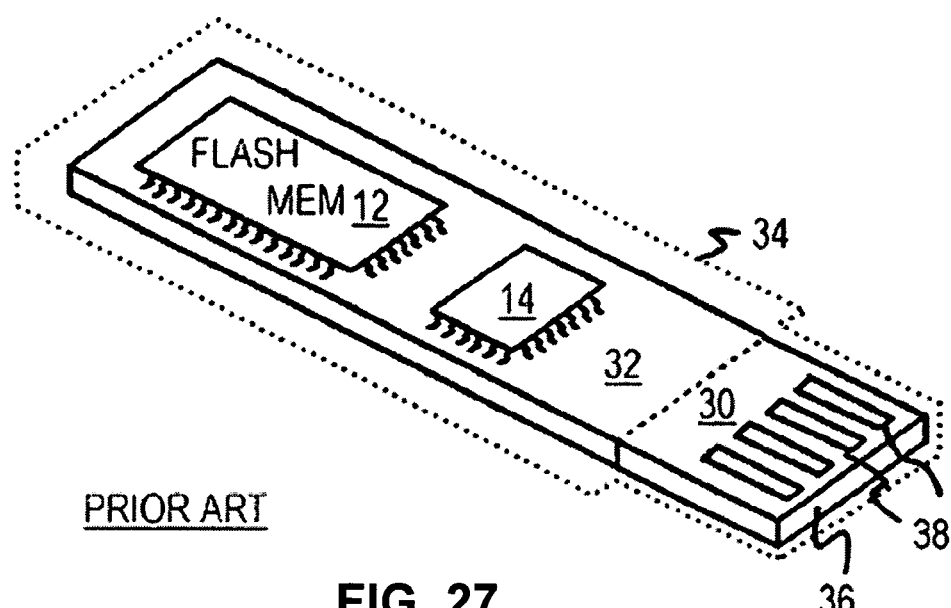
PRIOR ART
FIG. 27
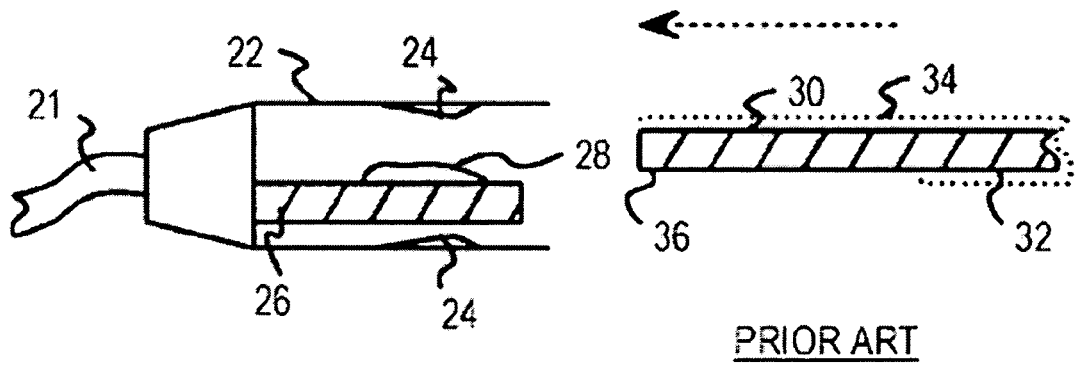
FIG. 28(A)   PRIOR ART
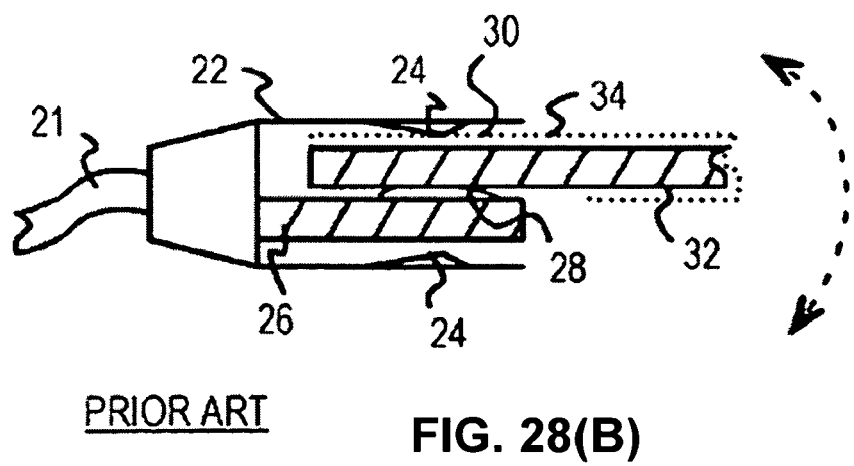
PRIOR ART   FIG. 28(B)

LOW-PROFILE USB DEVICE

FIELD OF THE INVENTION

This invention relates to portable electronic devices, and more particularly to portable electronic devices that utilize the Universal-Serial-Bus (USB) specification.

BACKGROUND OF THE INVENTION

Rapid advances in technology in several areas have converged to enable small, portable memory cards with vast capacities. Flash memory technologies such as those using electrically-erasable programmable read-only memory (EEPROM) have produced chips storing 128 M-Bytes or more. Small flash-memory cards have been designed that have a connector that can plug into a specialized reader, such as for compact-flash, secure-digital, memory stick, or other standardized formats.

More recently, flash memory cards are being sold that contain a USB connector. Such USB-flash memory cards do not require a specialized reader but can be plugged into a USB connector on a host system, such as a personal computer (PC). These USB-flash memory cards can be used in place of floppy disks. A USB-flash card can have a capacity of more than ten floppy disks in an area not much larger than a large postage stamp.

FIG. 25(A) shows a prior-art flash-memory card with a conventional male USB connector. Flash memory chip 12 may be a 128 Mega-byte non-volatile chip or may have some other capacity. Controller chip 14 contains a flash-memory controller that generates signals to access memory locations within flash memory chip 12. Controller chip 14 also contains a USB interface controller that serially transfers data to and from flash memory chip 12 over a USB connection.

Male USB connector 20 may be mounted on board 10, which is a small circuit board with chips 12, 14 mounted thereon. Multi-layer printed-circuit board (PCB) technology can be used for board 10. A plastic case (not shown) can surround board 10.

Male USB connector 20 contains a small connector substrate 16, which is often white ceramic, black rigid plastic, or another sturdy substrate. Connector substrate 16 has four or more metal contacts 18 formed thereon. Metal contacts 18 carry the USB signals generated or received by controller chip 14. USB signals include power, ground, and serial differential data D+, D−.

Male USB connector 20 contains a metal case that wraps around connector substrate 16. The metal case touches connector substrate 16 on three of the sides of connector substrate 16. The top side of connector substrate 16, holding metal contacts 18, has a large gap to the top of the metal case. On the top and bottom of this metal wrap are formed holes 15. USB connector 20 is a type-A USB connector.

FIG. 25(B) shows a female USB socket connector 22. Female USB socket connector 22 can be an integral part of a PC or other host system, or can be connected by cable 21 to such a host system. Another connector substrate 26 contains four metal contacts 28 that make electrical contact with the four metal contacts 18 of the male USB connector 20 of FIG. 25(A). Connector substrate 26 is wrapped by a metal case, but small gaps are between the metal case and connector substrate 26 on the lower three sides.

Locking is provided by metal springs 24 in the top and bottom of the metal case. When male USB connector 20 of FIG. 25(A) is flipped over and inserted into female USB socket connector 22 of FIG. 25(B), metal springs 24 lock into holes 15 of male USB connector 20.

FIGS. 26(A) and 26(B) are cross-sections highlighting connections between male and female USB connectors. Female USB socket connector 22 is on the left while male USB connector 20 is being inserted from the right. Male USB connector 20 is flipped over relative to the view of FIG. 25(A). Metal contacts 18 are formed on the lower surface of connector substrate 16 on male USB connector 20, while metal contacts 28 are formed on the upper surface of connector substrate 26 on female USB socket connector 22. Thus the metal contacts face one another to allow for electrical contact when male USB connector 20 is inserted into female USB socket connector 22 as shown in FIG. 26(B).

Metal springs 24 formed on the metal case surrounding connector substrate 26 on female USB socket connector 22 fit into holes on the metal case of male USB connector 20. This helps to lock the connectors together.

FIG. 27 shows a prior-art USB flash memory card using a low-profile USB connector. Male USB connector 20 of FIGS. 25 and 26 is relatively large. The metal case in particular is cumbersome and increases manufacturing cost. Costs may be reduced by integrating male USB connector 30 with board 32. Board 32 is a PCB that has flash memory chip 12 and controller chip 14 mounted thereon. Board 32 is extended to include male USB connector 30, which has metal contacts 38 formed on end 36 of board 32.

The width and thickness of board 32 at end 36 containing male USB connector 30 is designed to approximately match that of connector substrate 16 of FIG. 25(A). Plastic case 34 can enclose board 32 but have an opening for metal contacts 38. Plastic case 34 can cover the bottom and sides of male USB connector 30 up to end 36 to emulate potions of the metal case of the male USB connector of FIG. 25(A).

FIGS. 28(A) and 28(B) show cross-sections of the prior-art low-profile USB connector being inserted into a standard female USB connector. Board 32 that has male USB connector 30 formed on end 36 is flipped over from the view shown in FIG. 27, and end 36 is inserted into female USB socket connector 22 from the right side.

Metal contacts 38 are located on the lower surface of male USB connector 30. Plastic case 34 has an opening on the lower surface of male USB connector 30 to expose the metal contacts so they can make electrical connection with metal contacts 28 on the upper surface of connector substrate 26 of female USB socket connector 22 when inserted as shown in FIG. 28(B).

Plastic case 34 helps to fill the gate between board 32 and the top edge of the metal case of female USB socket connector 22. However, no holes are provided in plastic case 34, so metal springs 24 are pushed up slightly when male USB connector 30 is inserted into female USB socket connector 22. Plastic case 34 is also formed along the thin edges of board 32 and helps to fill in the gaps between connector substrate 26 and the sides of the metal case of female USB socket connector 22 that are above and below the plane of FIG. 28(B).

While low-profile USB connector 30 can be less expensive and smaller than the standard USB connector, it still has an undesirable thickness. The lack of the metal case facilitates some reduction in size at the plug end, but conventional fabrication processes mount the USB ICs on the same side of the PCB as the metal contacts, thus producing a body (handle) that is relatively thick.

What is needed is a substantially flat, low-profile male USB device having a minimal handle thickness, thus facilitating extremely thin USB devices that can be incorporated into pocket-carried items, such as key chains and pocket utility tools. What is also needed is a method for manufacturing such low-profile USB devices.

SUMMARY OF THE INVENTION

The present invention is directed to a low-profile USB device in which the thickness of the USB device's handle structure is substantially equal to and coplanar with a low-profile "(half-height") thickness of the USB device's plug structure. The low-profile plug structure thickness is determined by the plug receiving space located between the metal contacts and metal casing of a standard female USB socket connector, and the plug structure also has a width that is equal to the corresponding width of the plug receiving space defined by the standard female USB socket connector, thereby facilitating a snug (secure) fit between the plug structure and the standard female USB socket connector. To minimize the overall thickness of the USB device to the thickness of the plug structure, a PCBA is provided that includes metal contacts formed on a first (e.g., upper) surface of a PCB, and all IC components (e.g., USB controller chip, flash memory chip, etc.) mounted on the opposite (e.g., lower) surface of the PCB. A housing is then mounted or otherwise formed over the IC components (i.e., over the lower surface of the PCBA) that includes a plug section extending opposite to the metal contacts to provide the necessary plug structure thickness, and a handle section that covers the IC components. The housing has a planar cover plate that is parallel to the PCB and extends along the entire length of the USB device (e.g., from a front edge of the plug structure to a rear edge of the handle structure). Accordingly, the thickness of the handle structure is made substantially equal to the plug structure thickness, which is required for secure and reliable connection to a standard female USB socket connector, thus producing a flat, low-profile (thin) structure that can be easily carried in a user's pocket, or incorporated into a utility tool.

BRIEF DESCRIPTION OF THE DRAWINGS

These and other features, aspects and advantages of the present invention will become better understood with regard to the following description, appended claims, and accompanying drawings, where:

FIGS. 1(A) and 1(B) are perspective and cross sectional side views showing an exemplary USB device according to an embodiment of the present invention;

FIGS. 2(A) and 2(B) are cross-sectional end views showing a standard female USB socket connector and the plug structure of the USB device of FIG. 1(A) in separated and assembled conditions, respectively;

FIGS. 11(A) and 11(B) are exploded perspective and cross-sectional side views showing a USB device according to another embodiment of the present invention;

FIG. 12 is a cross-sectional side view showing a simplified plastic molding apparatus for producing the USB device shown in FIG. 11(A) according to another embodiment of the present invention;

FIG. 13 is a perspective view showing a molded USB device produced by the plastic molding apparatus of FIG. 12;

FIG. 20 is an exploded perspective view showing an USB device according to another embodiment of the present invention;

FIG. 21 is a perspective bottom view showing the upper housing structure of the USB device shown in FIG. 20;

FIG. 22 is a perspective view depicting an ultrasonic welding process utilized to complete fabrication of the USB device shown in FIG. 20;

FIGS. 26(A) and 26(B) are cross-sections highlighting connections between male and female USB connectors;

FIG. 27 shows a prior-art USB flash memory card using a low-profile USB connector; and FIGS. 28(A) and 28(B) show cross-sections of the prior-art low-profile USB connector being inserted into a standard female USB connector.

DETAILED DESCRIPTION OF THE DRAWINGS

The present invention relates to an improvement in low-profile USB connectors. The following description is presented to enable one of ordinary skill in the art to make and use the invention as provided in the context of a particular application and its requirements. As used herein, the terms "upper", "upwards", "lower", and "downward" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIGS. 1(A) and 1(B) are exploded and assembled perspective views showing a low-profile Universal-Serial-Bus (USB) device 100 according to a first embodiment of the present invention. USB device 100 generally includes a printed circuit board assembly (PCBA) 110 and a plastic housing 150 that is fixedly mounted onto PCBA 110.

Figure 3:
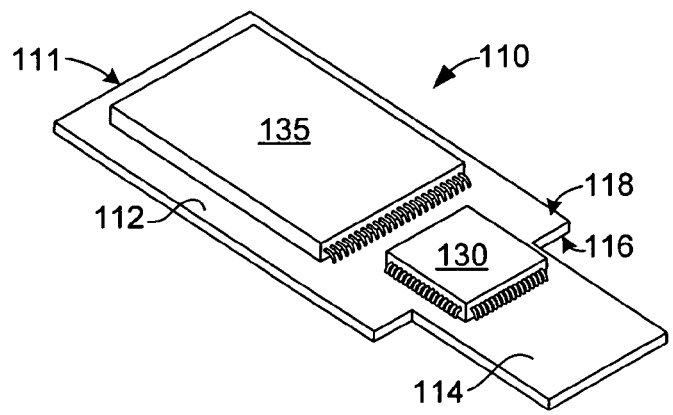
FIG. 3 is a perspective view showing a printed circuit board assembly (PCBA) of the USB device shown in FIG. 1(A)

Referring to the upper portion of FIG. 1(A) and to FIG. 3, PCBA 110 includes a printed circuit board (PCB) 111 including a relatively wide PCB handle section 112 and a relatively narrow PCB plug section 114 that extends from a front end of PCB handle section 112. PCB 111 is a substantially flat substrate, and has opposing sides that are referred to below as upper (first) surface 116 and lower (second) surface 118. Formed on upper surface 116 in plug section 114 are a plurality of metal contacts 120. Metal contacts 120 are shaped and arranged in a pattern established by the USB specification. According to an aspect of the invention, at least one control integrated circuit (IC) 130 and zero or more auxiliary ICs 135 (e.g., a flash memory device or an RF communication circuit) are mounted solely on lower surface 118 (i.e., on the side of PCB 111 opposite to metal contacts 120). ICs 130 and 135 are electrically connected to each other and to metal contacts 120 by way of metal traces 131 and 136, a few of which being depicted in FIG. 1(A) in a simplified manner by dashed lines. PCB 111 is formed in accordance with known PCB manufacturing techniques such that metal contacts 120 and ICs 130 and 135 (as well as zero or more other circuit components, which are omitted for brevity) are electrically interconnected by a predefined network including conductive traces 131 and 136 and other conducting structures that are sandwiched between multiple layers of an insulating material (e.g., FR4) and adhesive.

Housing 150 is arranged such that substantially all of the plastic used to form housing 150 is located below upper surface 116 of PCB 111. Housing 150 includes a peripheral wall 151 extending downward, perpendicular to PCB 111, and a lower cover plate 152 that extends parallel to PCB 111. For discussion purposes, the portion of peripheral wall 151 surrounding handle section 112 of PCB 111 is referred to below as handle wall section 151-1, and the section of peripheral wall 151 surrounding plug section 114 of PCB 111 is referred to below as plug wall section 151-2. Similarly, the portion of cover plate 152 covering handle section 112 of PCB 111 is referred to below as handle cover section 152-1, and the section of cover plate 152 covering plug section 114 of PCB 111 is referred to below as plug cover section 152-2.

Referring again to FIG. 1(A), a handle structure 102 of USB device 100 is formed by handle wall section 151-1, handle cover section 152-1, and the exposed upper surface 116 of PCB handle section 112. Similarly, a plug structure 105 of USB device 100 is formed by plug wall section 151-2, plug cover section 152-2, and the exposed upper surface 116 of PCB plug section 114.

Referring to FIGS. 2(A) and 2(B), a thickness T1 and width W1 of plug structure 105 is selected to produce a secure (snug) fit inside standard female USB socket connector 22 (described above). Referring to FIG. 2(A), a height H between metal contacts 28 (i.e., a lower surface of connector substrate 26) and a lower wall 23A of the surrounding metal case is set by the USB standard at approximately 2.5 mm. Thickness T1 is set, for example, at 2.4 mm to assure a snug fit of plug structure 105 inside lower region 25A of female USB socket connector 22 (i.e., without significant vertical wobble) with metal contacts 120 in secure electrical contact with metal contacts 28 (as indicated in FIG. 2(B)). Similarly, a width W between side walls 23B-1 and 23B-2 of the metal case is set by the USB standard at approximately 12.5 mm. Width W2 of plug structure 105 (i.e., between the outermost surfaces of side walls 151-2A and 151-2B) is set, for example, at 12 mm to further assure the snug fit of plug structure 105 inside lower region 25A of female USB socket connector 22. Note that plug structure 105 is referred to as "low-profile" and "half-height" herein in that plug structure 105 is only inserted into lower region 25A of female USB socket connector 22 (i.e., side regions 25B-1 and 25B-2 and upper region 25C, which are normally occupied by the metal case of a standard male USB plug connector, remain unoccupied by low-profile plug structure 105).

According to the present invention, lower cover plate 152 includes a planar surface 152-S that is parallel to the PCB, and defines a single plane such that a first thickness T1 of plug structure 105 (i.e., measured between upper PCB surface 116 and planar surface 152S adjacent to metal contacts 120) is substantially equal to a second thickness T2 of handle section 102 (i.e., measured between upper PCB surface 116 and planar surface 152 adjacent to IC 135. That is, as indicated in FIG. 1(B), USB device 100 is substantially flat along its entire length (i.e., from rear edge 151-1A to front edge 151-1B). The term "substantially flat" is meant to indicate that planar surface 152S is substantially parallel to an uppermost surface of USB device 100 along its entire length. In the embodiment shown in FIGS. 1(A) and 1(B), the uppermost surface of USB device 100 is defined in part by upper surface 116 of PCB 111, which is parallel to planar surface 152 along the entire length of USB 100. Similarly, the term "substantially flat" is also intended to cover embodiments described below in which the housing includes a thin wall structure that is formed on or otherwise contacts the upper surface of the PCB. In these embodiments, the thickness T2 of handle structure 102 may differ by a small amount (e.g., 5% from thickness T1 of plug structure 105.

According to an aspect of the present invention, the "flatness" associated with USB device 100 is achieved by mounting all of the IC "chips" and other electronic components of USB device 100 on lower surface 118 of PCB 111 (i.e., on the side opposite to metal contacts 120). That is, the minimum overall thickness of USB device 100 is determined by the thickness T1, which is required to maintain a snug connection between plug structure 105 and female USB socket connector 22 (as indicated in FIG. 2(B)). Because this arrangement requires that metal contacts 120 be located at the uppermost surface, and that plug wall section 151-2 plug and cover section 152-2 extend a predetermined distance below PCB 111 to provide the required thickness T1. Thus, the overall thickness of USB device 100 can be minimized by mounting the ICs 130 and 135 only on lower surface 118 of PCB 111. That is, if the ICs are mounted on upper surface 116, then the overall thickness of the resulting USB structure would be the required thickness T1 plus the thickness that the ICs extend above PCB 111 (plus the thickness of a protective wall, if used).

According to another aspect associated with the embodiment shown in FIGS. 1(A) and 1(B), upper surface 116 of PCB 111 is entirely exposed on the upper surface of USB device 100, thus facilitating the production of USB 100 with a maximum thickness equal to thickness T1 of plug structure 105. That is, because metal contacts 120 are formed on upper surface 116, and upper surface 116 defines the higher end of required plug structure thickness T1, the overall height of USB device 100 can be minimized by exposing upper surface 116 (i.e., by making any point on upper PCB surface 116 the uppermost point of USB device 100). As indicated in FIG. 1(A), in accordance with feature specifically associated with USB device 100, peripheral wall 151 extends around and covers the peripheral side edges of PCB 111, and an upper edge of peripheral wall 151 is coplanar with upper surface 116 of PCB 111. By covering the peripheral side edge of PCB 111, peripheral wall 151 prevents objects from wedging between PCB 111 and housing 150, thereby preventing undesirable separation of PCBA 110 from housing 150.

Referring again to FIG. 3, in accordance with another aspect of the present invention, PCBA 110 is fabricated using lead-free soldering materials and processes. Lead (Pb) is recognized as a hazardous material, and may at some point in time be banned from use. Conventional USB structures that utilize standard USB plug connectors typically require lead-based soldering methods to attach the standard plug structure to a plastic substrate. Lead-free soldering requires higher peak temperatures (about 240° C.) that can shrink or warp such plastic substrates, thereby making such conventional USB plug connector structures unsuitable for lead-free fabrication processes. In contrast, because metal contacts 120 are formed directly on PCB 111, which is formed, for example, using FR4. In addition, ICs 130 and 135 are provided as surface mount components that don't contain lead in their pins/balls, thereby further enabling lead-free fabrication. After the lead-free PCBA fabrication process is completed, plastic housing 150 is formed and/or assembled onto PCBA 110 according to the various specific embodiments described below to complete the manufacture of low-profile USB device 100.

Figure 4:
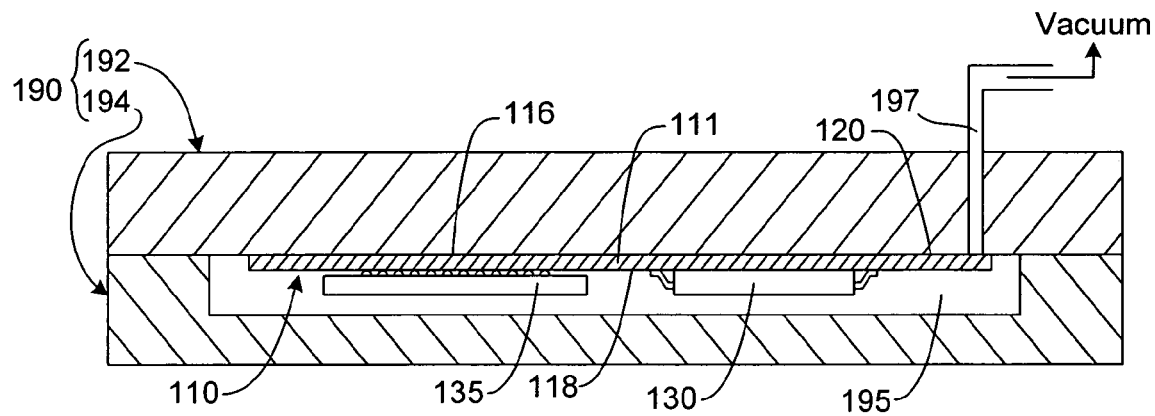
FIG. 4 is a cross-sectional side view showing a simplified plastic molding apparatus for producing the USB device shown in FIG. 1(A) according to another embodiment of the present invention.
Figure 5:
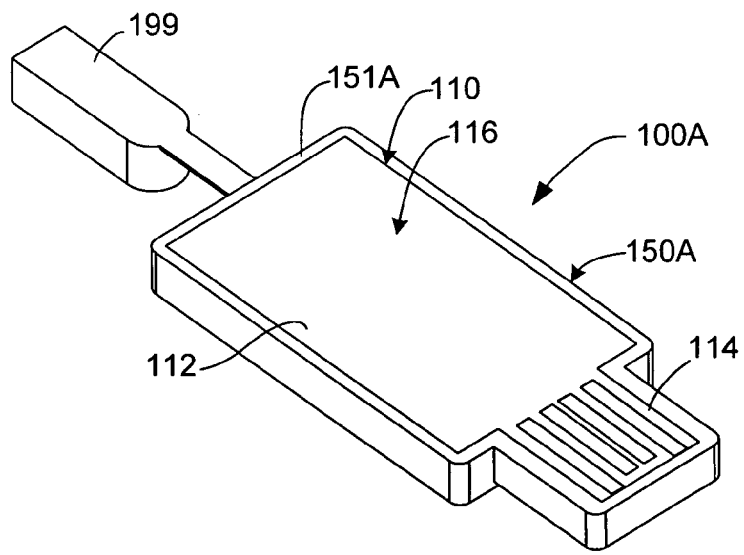
FIG. 5 is a perspective view showing a molded USB device produced by the plastic molding apparatus of FIG. 4.

FIG. 4 is a cross-sectional side view showing a simplified plastic molding apparatus 190 for producing a USB device according to another embodiment of the present invention. Plastic molding apparatus 190 includes an upper die structure 192 and a lower die structure 194 that define a cavity 195 therebetween. As indicated in FIG. 4, PCBA 110 is held inside cavity 195 by way of a vacuum mechanism 197, and then cavity 195 is filled with molten plastic material according to known plastic molding techniques. Note that PCB 111 is held such that upper surface 116 (and, hence, metal contacts 120) are pressed against upper die structure 192, thereby preventing the formation of molded plastic on these surfaces. As indicated in FIG. 4, as the injected molten plastic fills chamber 195, plastic material is formed directly on ICs 130 and 135, as well as on exposed portions of lower surface 118, thereby securing the resulting molded housing structure to PCBA 110. Note also that, by providing gaps between the peripheral edges of PCB 111 and the walls of chamber 195, molten plastic flows against these peripheral edges to form peripheral walls 151A (shown in FIG. 5). FIG. 5 shows an USB device 100A including a plastic housing 150A, along with a sprue 199, that are produced by molding apparatus 190. Note again that upper surface 116 of PCB 111, including both handle section 112 and plug section 114, are exposed through housing 150A, which is substantially identical to the generalized housing 150 of FIG. 1(A).

Figure 6A:
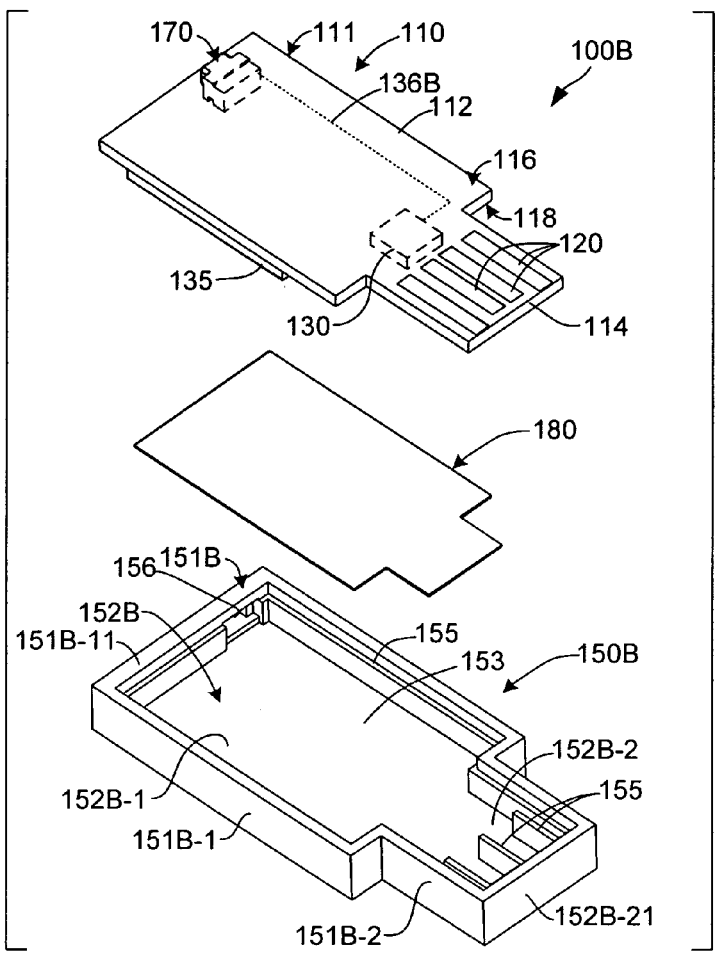
FIGS. 6(A) and 6(B) are exploded perspective and cross-sectional side views showing a USB device according to another embodiment of the present invention.
Figure 6B:
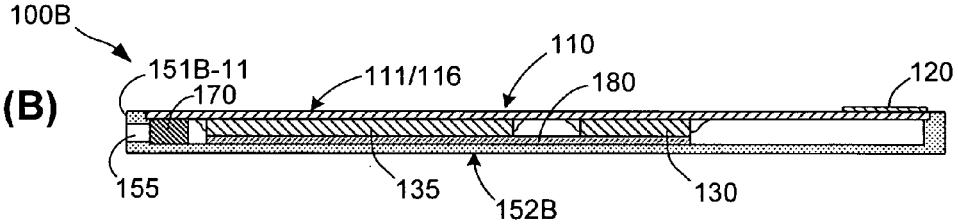

FIGS. 6(A) and 6(B) are exploded perspective and cross-sectional side views showing a USB device 100B according to another specific embodiment of the present invention. USB device 100B generally includes a plastic housing 150B that is attached to PCBA 110 by way of an adhesive layer 180.

Referring to the upper portion of FIG. 6(A), PCBA 110 is essentially identical to the structures described above, but also includes a light-pipe (light-generating device) mounted onto lower surface 118 adjacent to a back edge of PCB 111. Light-pipe 170 is controlled by a signal generated, for example by control IC 130 and transmitted over a trace 136B according to known techniques.

Referring to the lower portion of FIG. 6(A), housing 150B includes a peripheral wall 151B extending upward from a lower cover plate 152B. Similar to housing 150 of the general embodiment (discussed above), peripheral wall 151B includes a handle wall section 151B-1 and a plug wall section 151B-2, and cover plate 152B includes a handle cover section 152B-1 and a plug cover section 152B-2. Formed in peripheral wall 151B is a peripheral shelf 155 that supports the peripheral edge of PCB 111 when PCBA 110 is mounted onto housing 150B. A back wall 151B-11 of housing 150B defines an opening 156 that, when assembled, aligns with light-pipe 170 (as indicated in FIG. 6(B)) such that light generated by light-pipe 170 is visible through housing 150B. In addition, several support ribs 157 extend upward from plug cover section 152B-2 that, when assembled, contact and help support plug section 114 of PCB 111. As indicated in FIG. 6(B), when assembled, adhesive layer secures the lower surfaces of ICs 130 and 135 to the inside surface of cover plate 152B.

Figure 7A:
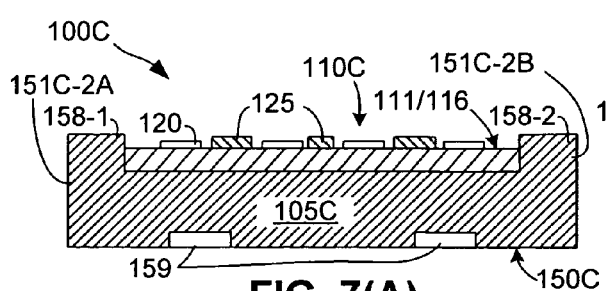
FIGS. 7(A) and 7(B) are cross-sectional end views showing a standard female USB socket connector and the plug structure of an USB device according to another embodiment of the present invention.
Figure 7B:
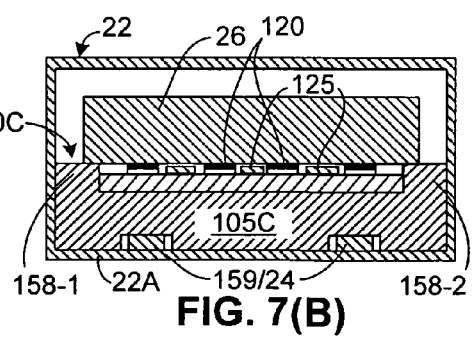

FIGS. 7(A) and 7(B) are cross-sectional end views showing a plug structure 105C of an USB device 100C according to another embodiment of the present invention. USB device 100C includes a housing 150C and PCBA 110C that are similar to the corresponding structures described above, with the following additional features and aspects.

According to a first aspect, housing 150C includes peripheral wall sections 151C-2A and 151C-2B on each side of plug structure 105C that respectively include end rail sections 158-1 and 158-2 that extend above upper surface 116 of PCB 111. As indicated in FIG. 7(B), end rail sections 158-1 and 158-2 are sized to press against the lower surface of connector substrate 26. Although this arrangement increases the overall thickness of USB device 100C, end rail sections 158-1 and 158-2 may provide a more secure engagement between plug structure 105C and standard female USB socket connector 22 than the embodiments described above.

In accordance with another aspect, PCB 111 includes elongated metal dividers 125 formed on upper surface 116, with each metal divider 125 being located between an adjacent pair of the metal contacts 120. Metal dividers 125 increase the rigidity of plug structure 105C, thus further enhancing the secure engagement between plug structure 105C and standard female USB socket connector 22.

In accordance with yet another aspect, one or more locking depressions 159 are formed in cover plate 152C. As indicated in FIG. 7(B), locking depressions 159 are aligned to engage with metal springs 24 protruding from bottom wall 22A of standard female USB socket connector 22, thus further enhancing the snug engagement between plug structure 105C and standard female USB socket connector 22.

The end rails, dividers, and locking depressions described above with reference to USB device 100C are described in additional detail in co-owned U.S. Pat. No. 6,854,984, which is incorporated herein by reference in its entirety. These features may be utilized alone or in combination, and may be included in any relevant embodiments disclosed herein.

Figure 8A:
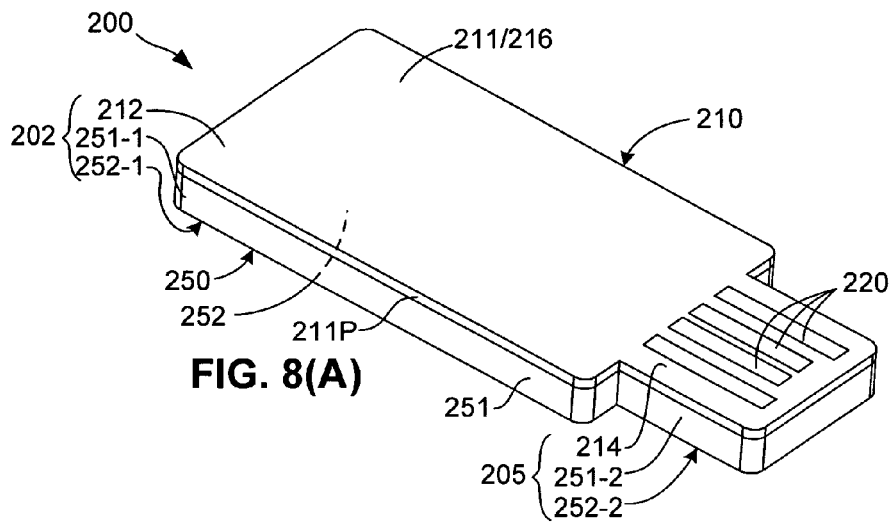
FIGS. 8(A) and 8(B) are exploded perspective and cross-sectional side views showing a USB device according to another embodiment of the present invention.
Figure 8B:
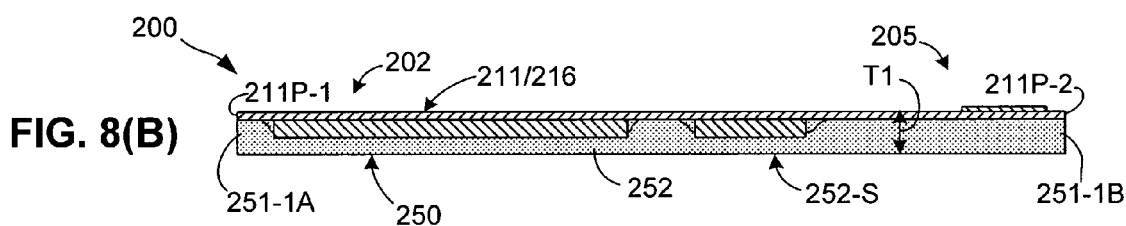

FIGS. 8(A) and 8(B) are perspective and cross-sectional side views showing a USB device 200 according to another specific embodiment of the present invention. USB device 200 generally includes a PCBA 210 and a plastic housing 250 that is attached to a lower surface of PCBA 210. PCBA 210 includes a PCB 211, metal contacts 220, and ICs (not shown) that are fabricated in essentially the same manner as described above with reference to PCBA 110, but differs in that the PCB 211 is somewhat larger than PCB 111. Housing 250 is also similar to housing 150 in that substantially all of the plastic used to form housing 250 is located below PCB 211, but in this case housing 250 is formed entirely below PCB 211 (i.e., such that the peripheral edges 211P of PCB 211 are exposed). Housing 250 includes a peripheral wall 251, and a lower cover plate 252 that extends parallel to PCB 111. Similar to the previous embodiments, a handle structure 202 is formed by a handle wall section 251-1, a handle cover section 252-1, and the exposed upper surface 216 of a PCB handle section 212, and a plug structure 205 is formed by a plug wall section 251-2, a plug cover section 252-2, and the exposed upper surface 216 of a PCB plug section 214. Also similar to the embodiments described above, as indicated in FIG. 8(B), USB device 200 has a uniform thickness T1 (measured from upper surface 216 of PCB 211 to the planar lower surface 252-S of cover plate 252) that extends along its entire length (i.e., from rear wall section 251-1A to front wall section 251-1B) plug structure 205 and handle structure 202.

Figure 9:
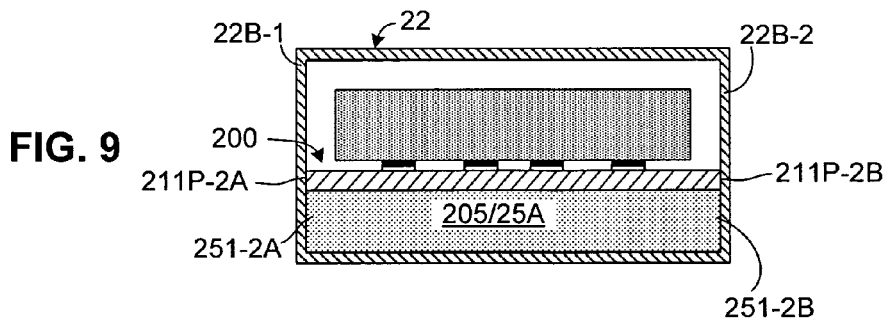
FIG. 9 is a cross-sectional end view showing the plug structure of the USB device of FIG. 8(A) inserted inside a standard female USB socket connector.

According to an aspect associated with USB device 200, peripheral edge 211P of PCB 211 extends to the outer edge of housing 250 such that peripheral edge 211P is aligned vertically with peripheral wall 251 of housing 250. For example, as shown in FIG. 8(B), rear peripheral edge portion 211P-1 is aligned vertically with the outer surface of rear wall section 251-1A, and front peripheral edge portion 211P-2 is aligned vertically with the outer surface of front wall section 251-1B. Similarly, as shown in FIG. 9, peripheral edge plug portions 211P-2A and 211P-2B are aligned vertically with the outer surfaces of wide plug wall sections 251-2A and 251-2B, respectively, such that peripheral edge plug portions 211P-2A and 211P-2B abut metal cage side walls 22B-1 and 22B-2 of standard female USB socket connector 22 when plug structure 205 is inserted into lower region 25A in the manner described above.

Figure 10:
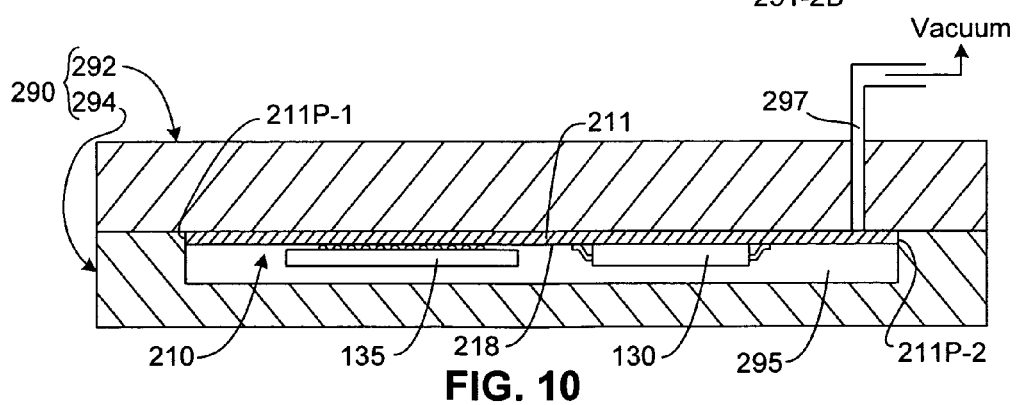
FIG. 10 is a cross-sectional side view showing a simplified plastic molding apparatus for producing the USB device shown in FIG. 8(A) according to another embodiment of the present invention.

FIG. 10 is a cross-sectional side view showing a simplified plastic molding apparatus 290 for producing USB device 200 according to another embodiment of the present invention. Plastic molding apparatus 290 includes an upper die structure 292 and a lower die structure 294 that define a cavity 295 therebetween. As indicated in FIG. 10, PCBA 210 is held inside cavity 295 by way of a vacuum mechanism 297 with the peripheral edge of substrate 211 abutting or overlapping the peripheral edge of PCB 211 (e.g., rear peripheral edge portion 211P-1 and front peripheral edge portion 211P-2), and then cavity 295 is filled with molten plastic material according to known plastic molding techniques. As indicated in FIG. 10, as the injected molten plastic fills chamber 295, plastic material is formed directly on ICs 130 and 135, as well as on exposed portions of lower surface 218, thereby securing the resulting molded housing structure to PCBA 210.

FIGS. 11(A) and 11(B) are perspective and cross-sectional side views showing a USB device 300 according to another embodiment of the present invention. USB device 300 generally includes a plastic housing 350 that is attached to PCBA 110 (described above). Housing 350 includes a lower portion 350-1 formed by a peripheral wall 351 and a lower cover plate 352 that is similar to housing 150 (described above). In addition, housing 350 includes a thin plastic top plate 358 that is formed over upper surface 116 of handle section 112 of PCB 111 and integrally molded with or attached to peripheral wall 351. Thus, a handle structure of USB device 300 includes a handle wall section 351-1 of peripheral wall 351, a lower cover section 352-1, and top plate 358. Note that, similar to the embodiments described above, a plug structure 305 of USB device 300 includes a plug wall section 351-2 of peripheral wall 351, a plug cover section 352-2 of lower cover plate 352, and the exposed upper surface 116 of a PCB plug section 114, thereby exposing metal contacts 120.

As indicated in FIG. 11(B), top plate 358 slightly increases the thickness of handle structure 302 over such that thickness T2 is slightly greater than thickness T1 of plug structure 305. However, by forming top plate 358 using a thin layer of plastic that mounts directly on upper surface 116, USB device 300 provides additional protection for PCBA 110 without significantly increasing the overall thickness of USB device 100. In addition, the offset between the upper surface of top plate 358 and upper surface 116 of exposed PCB plug section 114 facilitates protection of metal contacts 120 when USB device 100 is incorporated, for example into a utility tool (such as a Swiss army knife-type assembly).

FIG. 12 is a cross-sectional side view showing a simplified plastic molding apparatus 390A for producing a USB device 300A according to another specific embodiment of the present invention. Plastic molding apparatus 390A includes an upper die structure 392A and a lower die structure 394A that define a lower cavity 395A-1 located below ICs 130/135 and exposed portions of lower surface 118 of PCB 111, and an upper cavity 395A-2 exposing upper surface 116 over handle section 112 (upper surface 116 over plug section 114 is covered by upper die structure 392A in the manner and for the reasons described above). As indicated in FIG. 12, PCBA 110 is held inside cavity 295 by way of panelization sections that are pinched between upper die structure 392A and lower die structure 394A. After placing PCBA 110 into plastic molding apparatus 390A as indicated, cavities 395A-1 and 395-A2 are filled with molten plastic material according to known plastic molding techniques. As the injected molten plastic fills chambers 395A-1 and 395A-2, plastic material is formed directly on ICs 130 and 135, as well as on exposed portions of lower surface 118 and on upper surface 116 over handle section 112, thereby securing the resulting molded housing structure to PCBA 110. After the molding process, the resulting USB device is removed from plastic molding apparatus 390A and any protruding panelization sections are trimmed. FIG. 13 shows an USB device 300A including an integrally molded plastic housing 350A that includes top plate 358A integrally connected to upper edges of handle wall section 351A-1 that is produced by molding apparatus 390A (described above). Note again that upper surface 116 of PCB plug section 114 is exposed in plug structure 305A to allow access to metal contacts 120 during operation.

Figure 14:
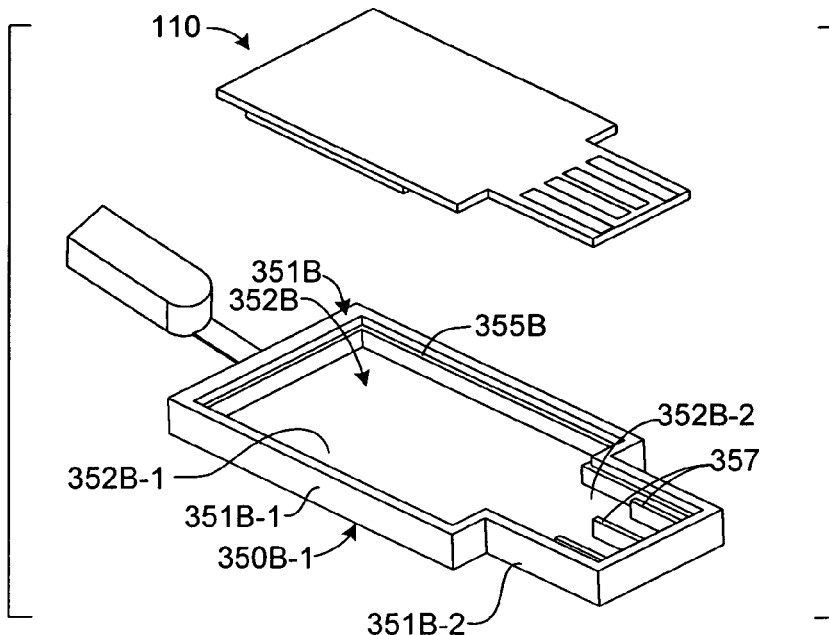
FIG. 14 is an exploded perspective view showing a partially assembled USB device according to another embodiment of the present invention.

FIG. 14 is an exploded perspective view showing portions of a USB device that are assembled using a two-step molding process according to another specific embodiment of the present invention. First, a pre-molded plastic housing portion 350B-1 is formed according to known plastic molding techniques for receiving PCBA 110 (described above). Housing portion 350B-1 includes a peripheral wall 351B extending upward from a lower cover plate 352B. Similar to housing 150B (discussed above), peripheral wall 351B includes a handle wall section 351B-1 and a plug wall section 351B-2 that define a peripheral shelf 355 for supporting the peripheral edge of PCB 111 when PCBA 110 is mounted onto housing portion 350B-1 during the two-step molding process. In addition, cover plate 352B includes a handle cover section 352B-1 and a plug cover section 352B-2. In addition, several support ribs 357 extend upward from plug cover section 352B-2 that, when assembled, contact and help support plug section 114 of PCB 111.

Figure 15:
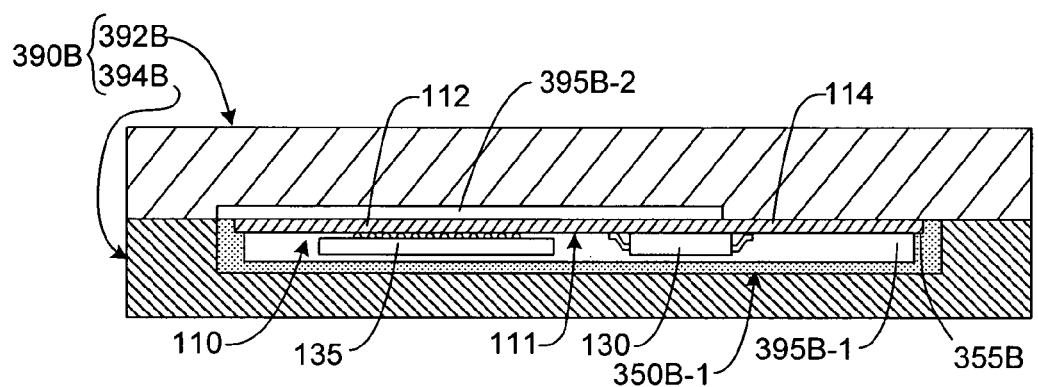
FIG. 15 is a cross-sectional side view showing a simplified plastic molding apparatus for completing the production of the USB device shown in FIG. 14 according to another embodiment of the present invention.
Figure 16:
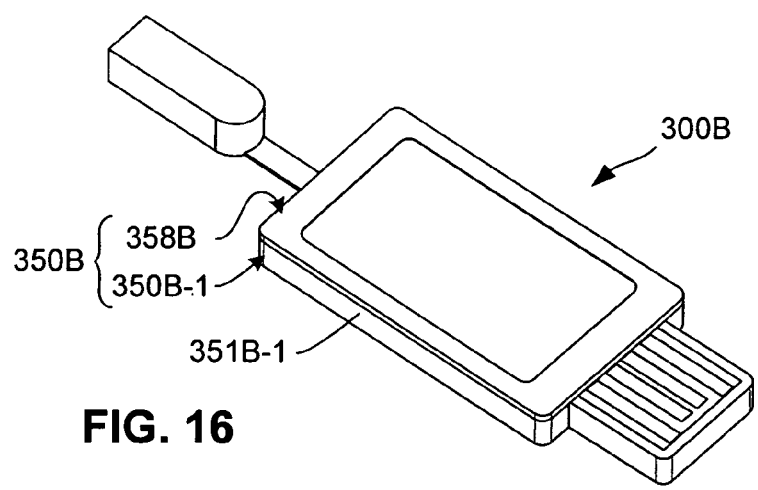
FIG. 16 is a perspective view showing the completed USB device produced by the plastic molding apparatus of FIG. 15.

FIG. 15 is a cross-sectional side view showing a simplified plastic molding apparatus 390B for performing the second phase of the two-step molding process. Plastic molding apparatus 390B includes an upper die structure 392B defining an upper cavity 395-B2 and a lower die structure 394B defining a lower cavity 395-B1. As indicated in FIG. 15, an assembly including lower housing portion 350B-1 and PCBA 110 is mounted into a lower cavity 395B-1 such that pre-molded plastic housing portion 350B-1 abuts the inside surface of lower die structure 394B, and PCBA 110 is mounted on housing portion 350B-1 such that a peripheral edge of PCB 111 is supported by peripheral shelf 355B. Upper die structure 392B is then mounted over lower die structure 394B such that upper cavity 395B-2 is formed over PCB handle portion 112. Molten plastic material is then injected into upper cavity 395B-2 using known techniques, thereby forming an upper cover plate 358B (shown in FIG. 16). FIG. 16 shows a completed USB device 300B including an integrally molded plastic housing 350B that includes top plate 358B integrally molded onto upper edges of handle wall section 351B-1 of lower housing portion 350B-1.

Figure 17:
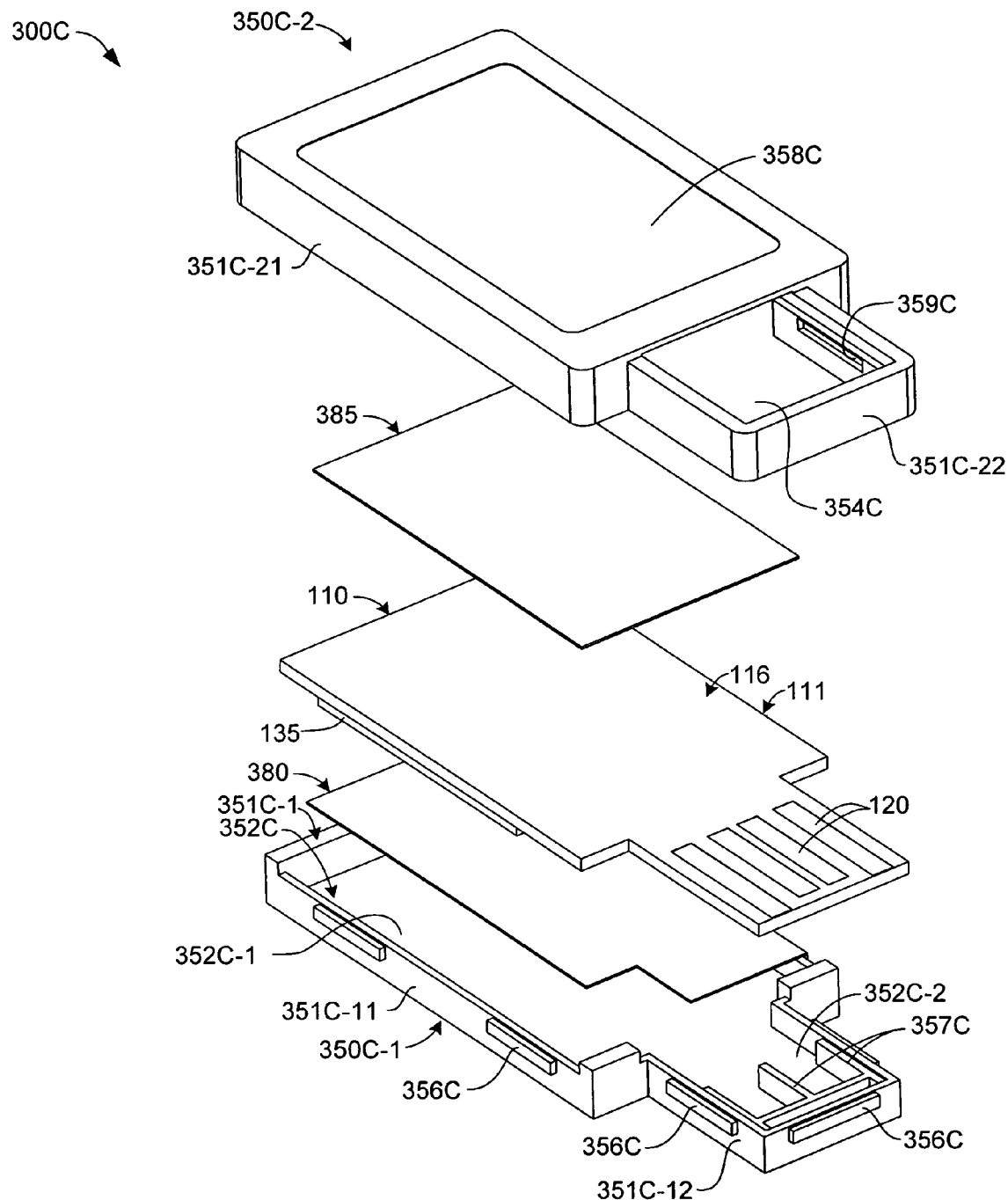
FIG. 17 is an exploded perspective view showing an USB device according to another embodiment of the present invention.

FIG. 17 is an exploded perspective view showing an USB device 300C according to another specific embodiment of the present invention. USB device 300C generally includes a lower (first) housing portion 350C-1, and upper (second) housing portion 350C-2, PCBA 110, a lower (first) adhesive layer 380, and an upper (second) adhesive layer 385.

Lower housing portion 350C-1 generally includes a lower (first) cover plate 352C (including a handle cover section 352C-1 and a plug cover section 352C-2) and an inner peripheral wall 351C-1 (including a handle wall section 351C-11 and a plug wall section 351C-12) extending upward from (perpendicular to) opposing edges of cover plate 352C. Several support ribs 357C extend upward from plug cover section 352B-2 that, when assembled, contact and help support plug section 114 of PCB 111.

Upper housing portion 350C-2 generally includes an outer peripheral wall 351C-2 (including a handle wall section 351C-21 and a plug wall section 351C-22) that are sized to fit over inner peripheral wall 351C-1 in the manner described below, and a thin plastic top plate 358C that is integrally formed on upper edges of handle wall section 351C-21. Note that plug wall section 351C-22 defines an opening 354C.

In accordance with an aspect of the present embodiment invention, lower housing portion 350C-1 and upper housing portion 350C-2 are fabricated such that the housing portions can be snap-coupled over PCBA 110 during the housing assembly process. In particular, the respective peripheral walls of housing portions 350C-1 and 350C-2 are constructed such that inner peripheral wall 351C-1 can be inserted inside peripheral wall 351C-2, whereby the outside surfaces of peripheral wall 351C-1 abut the inside surfaces of peripheral wall 351C-2. In addition, either a slot or a tab are provided on the outside surface of inner peripheral walls 351-C1, and a corresponding tab or slot are provided on the inside surfaces of outer peripheral wall 351C-2, wherein each tab is snap-coupled into a corresponding slot when upper housing portion 350C-1 is mounted onto the lower housing portion 350C-2. In the present embodiment, the outside surfaces of peripheral walls 351C-1 of lower housing portion 350C-1 includes tabs 356C, and the inside surfaces of peripheral walls 351C-2 of upper housing portion 350C-2 defines corresponding slots 359C such that each tab 356C is snap-coupled into a corresponding slot 359C when upper housing portion 350C-2 is mounted onto lower housing portion 350C-1. Note that the number of slots/tabs provided on each peripheral wall may be substantially arbitrarily selected, as well as the peripheral wall (inner or outer) on which the tabs/slots are provided.

According to another aspect of the present invention, adhesive layers 380 and 385 are respectively provided between a lower surface (e.g., the surface of IC 135 facing away from PCB 111) and lower cover plate 352C, and between an upper surface 116 of PCB 111 and top plate 358C in order to substantially permanently secure the housing formed by lower housing portion 350C-1 and upper housing portion 350C-2 over PCBA 110. Although the snap-coupling arrangement described above is typically sufficient to prevent separation of housing portions 350C-1 and 350C-2 under normal operating conditions, the two housing portions may be separated, in the absence of adhesive, by sufficiently strong opposing (shear) forces applied in the plane of the upper and lower cover plates, which can act to deform the respective peripheral walls and disengaging the tab/slot connections. To prevent such disassembly, adhesive layers 380 and 385 serve to secure housing portions 350C-1 and 350C-2 together by way of PCBA 110. As mentioned above, PCBA 110 is formed using conventional PCB assembly procedures, and as such IC 135 is rigidly secured to PCB 111. When secured to lower housing portion 350C-1 by way of adhesive layer 380 and upper housing portion 350C-2 by way of adhesive layer 385, PCBA 110 helps resist separation of the housing portions in response to an applied shearing force by resisting relative movement of the housing portions.

In accordance with an embodiment of the present invention, adhesive layers 380 and 385 are pressure or heat activated, and mounted onto the inner surfaces of housing portions 350C-1 and 350C-2 before the assembly process is performed. In this manner, the snap-coupling procedure may be completed and reversed, if necessary, before permanent connection of housing portions 350C-1 and 350C-2 to PCBA 110 (e.g., in response to an applied pressure or heat). Alternatively, a standard adhesive may be used, but this may result in inadvertently gluing the housing portions together in a non-optimal position. In yet another embodiment, a liquid adhesive may be injected into the housing after the snap-coupling process to secure the PCBA to the cover plates.

Figure 18:
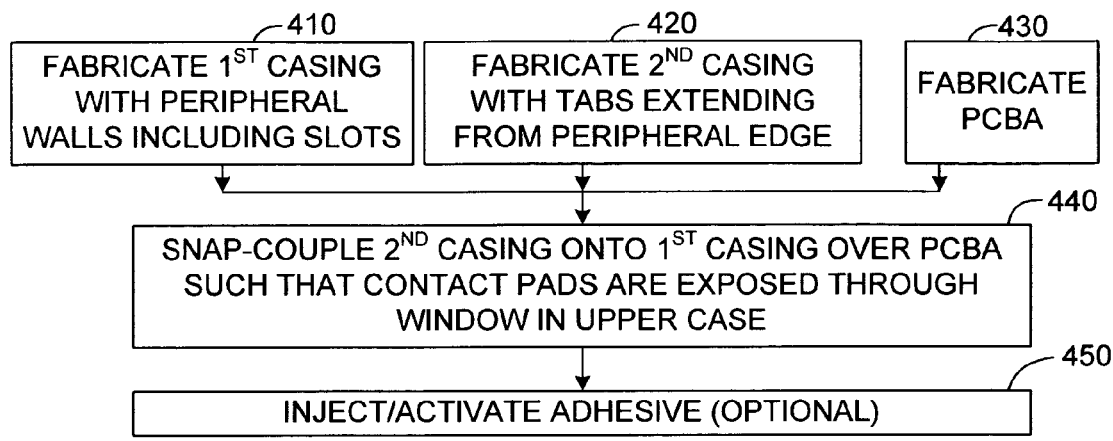
FIG. 18 is a flow diagram showing a method for assembling the USB device of FIG. 17 according to another embodiment of the present invention.

FIG. 18 is a flow diagram depicting a method for manufacturing USB devices according to another embodiment of the present invention. The method begins by forming (e.g., by plastic injection molding) a first housing portion (block 410), a second housing portion (block 420), and a PCBA (block 430). First housing portion (e.g., lower housing portion 350C-1) and second housing portion (e.g., upper housing portion 350C-2) may be formed, for example, using known plastic injection molding techniques, to include corresponding tabs and slots in the respective peripheral walls in order to facilitate the snap-coupling process described herein. Note that PCBA may be formed at a significantly different time frame from the housing portions, thereby facilitating the sale of the housing portions in an assembly kit. Next, the housing portions are mounted over the PCBA and snap-coupled together such that the contact pads 120 formed on PCB plug section 114 are exposed through window 359C formed in upper housing portion 350C-2 (block 440). Finally, when a press- or heat-activated adhesive is used, or when adhesive is injected into the housing, this adhesive is activated/injected into the housing to permanently secure the housing portions together (block 450). Note that the injecting/activating process may be omitted when an adhesive that does not require activation is provided on one of the PCBA or the housing portions prior to the assembly process.

Figure 19A:
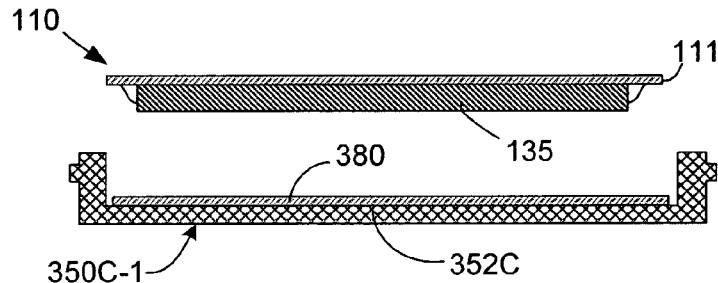
FIGS. 19(A), 19(B) and 19(C) are cross-sectional end views depicting the USB device of FIG. 17 during successive assembly stages.
Figure 19B:
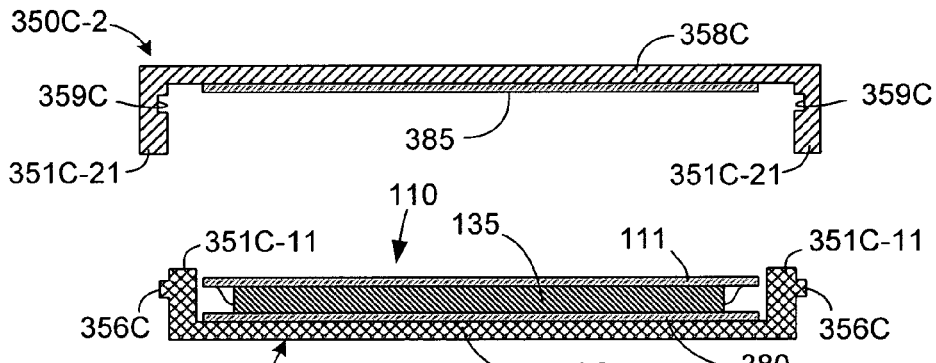
Figure 19C:
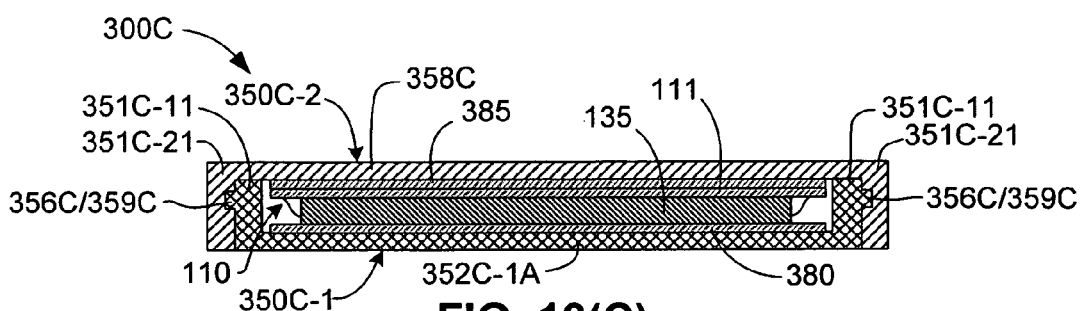

FIGS. 19(A) to 19(C) are cross-sectional end views depicting the snap coupling process associated with the assembly methods of FIG. 18. Referring to FIG. 19(A), PCBA 110 is positioned over lower housing portion 350C-1 with IC 135 facing downward. Note that adhesive layer 380 is already mounted on the inside (upper) surface of lower cover plate 352C. FIG. 19(B) depicts a sub-assembly formed by PCBA 110 and lower housing portion 350C-1, and also depicts upper housing portion 350C-2 positioned over the sub-assembly prior to snap coupling. IC 135 is secured to lower cover plate 352C by way of adhesive layer 380, and adhesive layer 385 is already mounted on the inside (lower) surface of top plate 358C. Side walls 351C-21 and 351C-22 of upper housing portion 350C-2 are positioned over side walls 351C-11 and 351C-12 of lower housing portion 350C-1, and then moved downward until tabs 356C engage slots 359C. FIG. 19(C) shows completed USB device 300C, with upper housing portion 350C-2 mounted onto lower housing portion 350C-1 such that tabs 356C are snap coupled into slots 359C, and top plate 358C is secured to PCB 111 by way of adhesive layer 385.

FIG. 20 is an exploded perspective view showing an USB device 500 according to yet another specific embodiment of the present invention. USB device 500 includes a lower (first) housing portion 550-1, and upper (second) housing portion 550-2, and PCBA 110. Lower housing portion 550-1 includes a planar lower cover plate 552 having a relatively wide handle cover section 552-1 and a relatively narrow plug cover section 552-2, and several support ribs 557 extending upward from plug cover section 552-2. Upper housing portion 550-2 generally includes a peripheral wall 551 including a handle wall section 551-1 and a plug wall section 551-2 that define a peripheral shelf 555 (shown in FIG. 21), and a thin plastic top plate 558 that is integrally formed on upper edges of handle wall section 551-1. Note that plug wall section 551-2 defines an opening 554.

In accordance with an aspect of the present embodiment invention, as indicated in FIG. 21, a peripheral shelf 555 is formed in peripheral wall sections 551-1 and 551-2, and several welding structures 559 are formed on peripheral shelf 555. When upper housing portion 550-2 is mounted over PCBA 110 and onto lower housing portion 550-1, the peripheral edge of lower cover plate 552 become engaged in peripheral shelf 555. Subsequently, ultrasonic energy is applied through the peripheral edge of lower cover plate 552 (as indicated by arrows in FIG. 22), thereby melting the welding structures, thus welding upper housing 550-2 to lower housing 550-1 and completing the fabrication of USB device 500.

Figure 23:
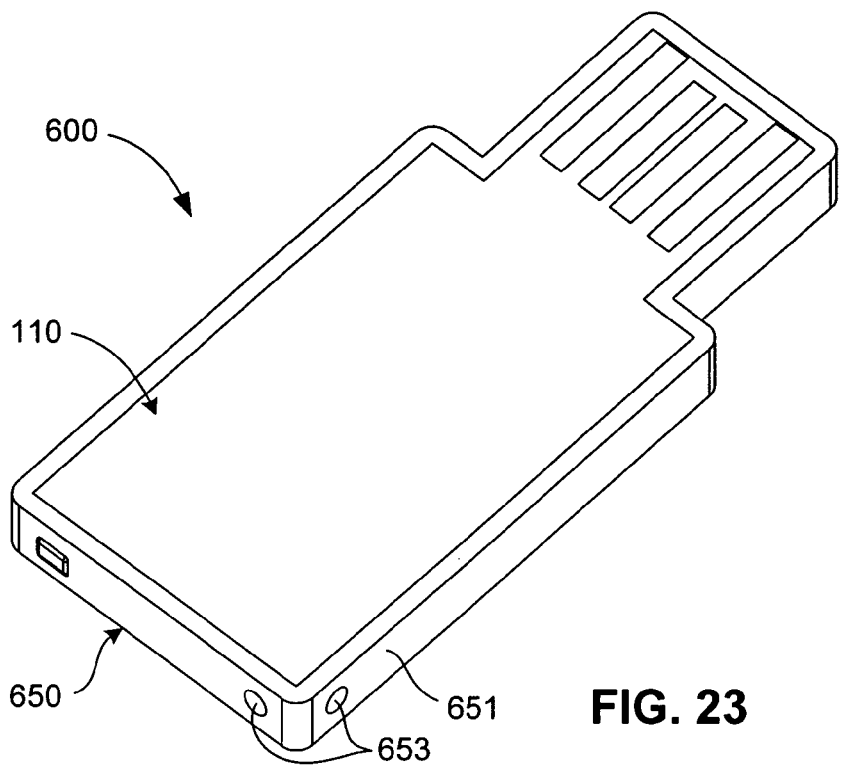
FIG. 23 is a perspective view showing a keychain-type USB device produced in accordance with another embodiment of the present invention.

The various low-profile USB device structures described herein may be beneficially utilized for various portable applications and modified for various purposes due to their substantially flat design. For example, as indicated in FIG. 23, a key chain-type USB device 600 may include a housing 650 having a peripheral wall 651 defining one or more holes 653 for receiving a key chain, thus providing a dual-use structure that can be easily carried in a user's pocket. In addition, the various low-profile USB device structures may be modified to serve as convenient external storage for, for example, MP3 players (i.e., media storage for music), digital cameras, and mobile phones.

Figure 24:
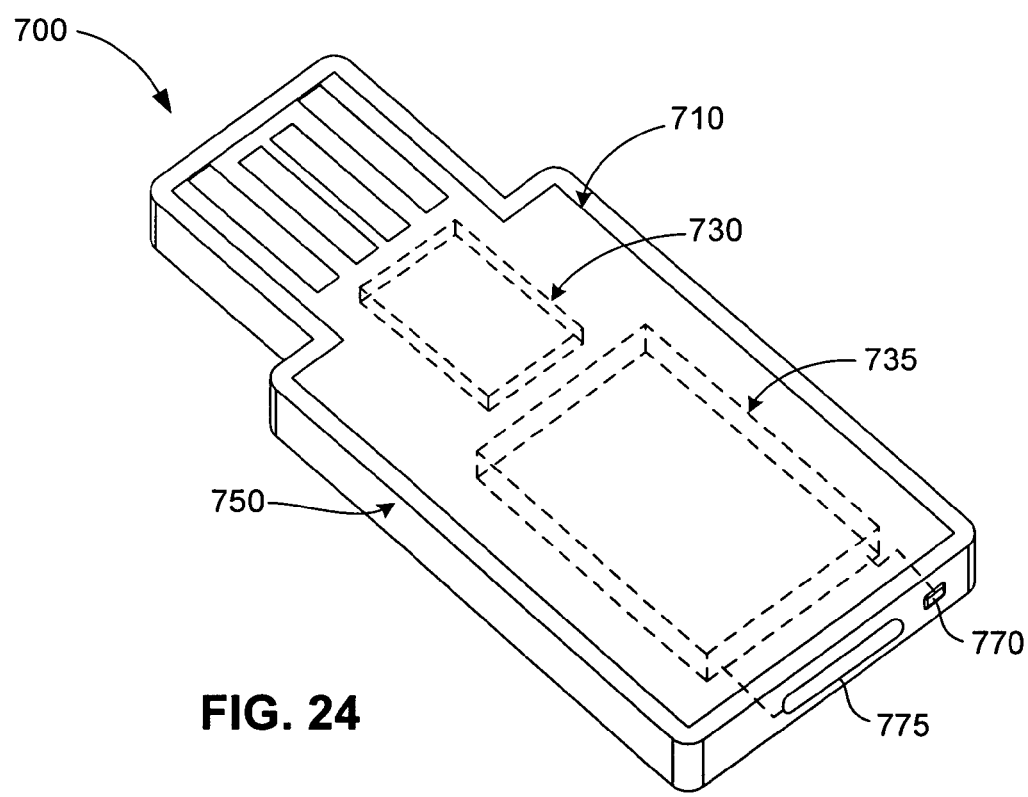
FIG. 24 is a perspective view showing a wireless communication-type USB device produced in accordance with another embodiment of the present invention.
Figure 25A:
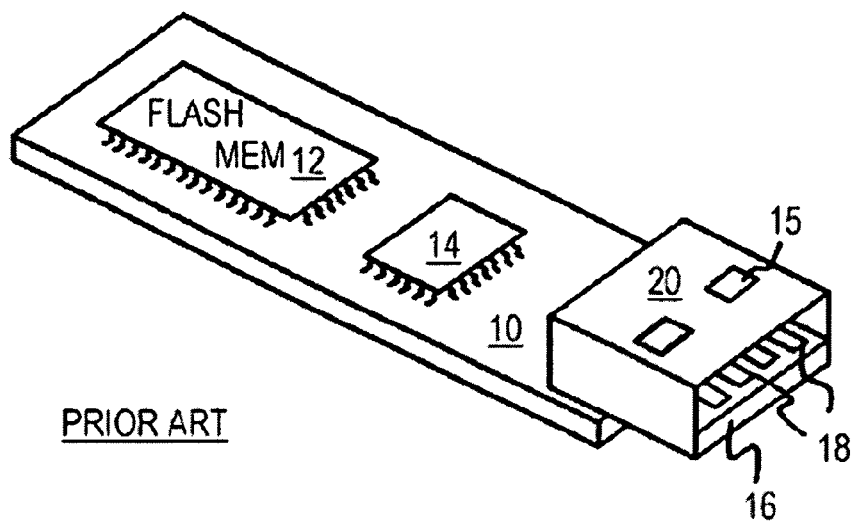
FIG. 25(A) shows a prior-art flash-memory card with a USB connector.
Figure 25B:
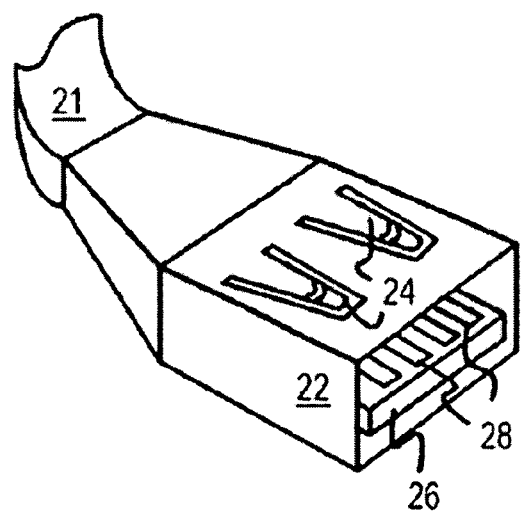
FIG. 25(B) shows a female USB connector.

Another embodiment utilizes the disclosed USB device structures to facilitate wireless communications. In this case, a USB device (e.g., Bluetooth USB adapter 700 shown in FIG. 24) may be plugged into the USB port of a host device, and may include a wireless communication device 735 that generates wireless signals emitted from transceiver antenna 775, which may be provided on a back side of housing 750 to maximize the effect of signal transmission. Wireless communication device 735 communicates with a host (e.g., a computer) via USB control IC 730, and includes a Bluetooth controller, a radio frequency (RF) transceiver, a baseband controller, memory (e.g., EEPROM), a voltage regulator, a crystal, and a control circuit for controlling LED 770. These circuits may be combined together, along with passive circuits (e.g., resistors, capacitors and inductors) in a single chip, as depicted, or formed on one or more separate chips that are mounted on PCB 710 and enclosed by housing 750. Such an arrangement would facilitate communication between the host and a wireless communication device, such as a BlueTooth-enabled device. Bluetooth is a wireless technology that enables any electrical device to wirelessly communicate in the 2.4 GHz frequency band. It allows devices such as mobile phones, headsets, PDA's and computers to communicate and send data to each other without the need for wires or cables to link to devices together. It has been specifically designed as a low cost, low power, radio technology, which is particularly suited to the short range Personal Area Network (PAN) application. By plugging Bluetooth USB adapter 700 into the USB port, the Bluetooth USB adapter enables a non-Bluetooth electrical device (i.e., the host) to communicate with Bluetooth enabled devices. One specific wireless application may be a BlueTooth mouse device, which are used today for cursor pointing. Another application example is allowing computer user doing two-way communication to Bluetooth-wireless equipped mobile phones, PDA, keyboard, printer, digital camera, and MP3 player. Other applications may include wireless headsets. Yet another application may include enabling BlueTooth wireless connections inside an automobile to facilitate "hands free" operation of a mobile phone. Of course, other wireless communication protocols, such as IrDA infrared transmitting devices, may also be utilized in conjunction with USB devices of the present invention.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A low-profile Universal-Serial-Bus (USB) device comprising:
   a printed circuit board assembly (PCBA) including:
      a printed circuit board (PCB) including a relatively wide PCB handle section and a relatively narrow PCB plug section, the PCB having opposing first and second surfaces,
      a plurality of metal contacts disposed on the first surface of the PCB plug section,
      at least one integrated circuit (IC) mounted on the second surface of the PCB, the IC including means for processing USB signals, and
      a plurality of conductive traces mounted on the PCB, each conductive trace extending between an associated metal contact and the IC; and
   a housing attached to the PCBA and including a cover plate extending over both the PCB handle section and the PCB plug section,
   wherein the cover plate includes a planar surface that is parallel to the PCB,
   wherein a first thickness measured between the first surface of the PCB and the planar surface adjacent to the metal contacts is substantially equal to a second thickness between the first surface of the PCB and the planar surface adjacent to the IC, and
   wherein substantially all of the housing is located between the first surface and the cover plate.

2. The low-profile USB device of claim 1, wherein the PCBA comprises a lead-free structure.

3. The low-profile USB device of claim 1, wherein the housing is arranged such that the entire first surface of the PCB handle section is exposed and forms at least part of an upper surface of the USB device.

4. The low-profile USB device of claim 1, wherein the housing further comprises a peripheral wall extending around a peripheral edge of the PCB such that an upper edge of the peripheral wall covers the peripheral edge of the PCB, and an upper edge of the peripheral wall is substantially coplanar with the first surface of the PCB.

5. The low-profile USB device of claim 4, wherein the housing comprises a molded material formed on the ICs and the second surface of the PCB.

6. The low-profile USB device of claim 4, wherein the cover plate of the housing is secured to said at least one IC by an adhesive layer.

7. The low-profile USB device of claim 4, further comprising a light-producing device mounted on the second surface of the PCB, wherein a peripheral wall of the housing defines an opening aligned such that the light-producing device is visible through the opening.

8. The low-profile USB device of claim 4, wherein the peripheral wall includes end rail sections extending above the first surface of the PCB.

9. The low-profile USB device of claim 1, wherein the PCB further comprises metal dividers formed on the first surface of the PCB, each of the metal dividers being located between an adjacent pair of the metal contacts.

10. The low-profile USB device of claim 1, wherein the cover plate defines one or more locking depressions.

11. The low-profile USB device of claim 1, wherein outer surfaces of the peripheral wall of the housing is aligned with a peripheral edge of the PCB.

12. The low-profile USB device of claim 1, wherein the housing further comprises:
   a thin plastic plate mounted on the first surface of the PCB handle section.

13. The low-profile USB device of claim 12, wherein the housing further comprises:
   a peripheral wall extending around a peripheral edge of the PCB, the peripheral wall having a lower edge integrally molded to a peripheral edge of the cover plate; and
   a thin plastic plate integrally molded to an upper edge of the peripheral wall, the thin plastic plate extending over the first surface of the PCB handle section.

14. The low-profile USB device of claim 13, wherein the housing comprises a molded material formed on the ICs and the second surface of the PCB.

15. The low-profile USB device of claim 13, wherein the peripheral wall includes a peripheral shelf, and wherein the PCBA is mounted on housing such that a peripheral edge of the PCB is supported by the peripheral shelf.

16. The low-profile USB device of claim 1, wherein the housing comprises:
   a first housing portion including the cover plate and a first peripheral wall extending perpendicular to the cover plate;
   a plurality of tabs formed on an outside surface of the first peripheral wall;
   a second housing portion including a top plate and a second peripheral wall extending perpendicular to the top plate, wherein an inside surface of the second peripheral wall defines a plurality of slots arranged such that, when the second housing portion is mounted over the first housing portion, each of the tabs formed on the first peripheral wall engage a corresponding slot.

17. The low-profile USB device of claim 16, further comprising a first adhesive layer disposed between the PCBA and the cover plate, and a second adhesive layer disposed between the first surface of the PCB and the top plate.

18. The low-profile USB device of claim 1, wherein the housing comprises:
   a first housing portion including the cover plate;
   a second housing portion including a peripheral wall having a handle wall section and a plug wall section, the second housing portion also including a top plate mounted on the handle wall section, wherein a window is defined by the plug wall section,
   wherein the second housing portion is mounted onto the first housing portion such that a peripheral edge of the cover plate is ultrasonically welded onto the peripheral wall, such that the PCB handle portion is positioned between a first portion of the cover plate, and such that the metal contacts are exposed through the window.

19. The low-profile USB device of claim 1, wherein the housing defines at least one hole for receiving a key chain therein.

20. The low-profile USB device of claim 1, wherein the ICs include a wireless communication transmission device.

21. A method for manufacturing (Universal Serial Bus) devices comprising:
   forming a first housing portion including a first cover plate and a peripheral wall extending from the first cover plate and defining a plurality of peripheral slots, a second housing portion including a second peripheral wall having a plurality of tabs extending from the peripheral wall, and a PCBA; and
   snap-coupling the second housing portion to the first housing portion such that each of the tabs is received inside a corresponding slot of the plurality of peripheral slots, and such that the PCBA is sandwiched between first and second housing portions with a first adhesive layer between a first surface of the PCBA and the first cover plate and a second adhesive layer between a second surface of the PCBA and the second cover plate.

* * * * *